United States Patent
Jiang (10) Patent No.: US 10,332,989 B2
(45) Date of Patent: Jun. 25, 2019

(54) BACK-CHANNEL-ETCHED TFT SUBSTRATE AND MANUFACTURING METHOD THEREOF

(71) Applicant: Shenzhen China Star Optoelectronics Semiconductor Display Technology Co., Ltd., Shenzhen (CN)

(72) Inventor: Chunsheng Jiang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/749,101

(22) PCT Filed: Dec. 20, 2017

(86) PCT No.: PCT/CN2017/117314
§ 371 (c)(1),
(2) Date: Jan. 30, 2018

(65) Prior Publication Data
US 2019/0157431 A1 May 23, 2019

(30) Foreign Application Priority Data

Nov. 21, 2017 (CN) .......................... 2017 1 1168930

(51) Int. Cl.
*H01L 21/02* (2006.01)
*H01L 27/12* (2006.01)
(Continued)

(52) U.S. Cl.
CPC .. *H01L 29/66969* (2013.01); *H01L 21/02628* (2013.01); *H01L 21/3213* (2013.01);
(Continued)

(58) Field of Classification Search
CPC . H01L 29/7869–78696; H01L 27/1225; H01L 29/04–045; H01L 21/02483;
(Continued)

(56) References Cited

U.S. PATENT DOCUMENTS

2011/0097842 A1* 4/2011 Yang ...................... B82Y 30/00
                                                                      438/104
2013/0280859 A1* 10/2013 Kim ..................... H01L 29/7869
                                                                      438/104
(Continued)

FOREIGN PATENT DOCUMENTS

CN        102668028 A        9/2012
CN        103779425 A        5/2014
(Continued)

*Primary Examiner* — Stephen M Bradley
(74) *Attorney, Agent, or Firm* — Leong C. Lei (57) ABSTRACT

The invention provides a BCE TFT substrate and manufacturing method thereof. The method comprises forming a first IGZO thin film with polycrystalline IGZO particles in a predetermined area of active layer before sputtering IGZO, the polycrystalline IGZO particles in the first IGZO thin film used as seed crystal during sputtering to grow a C-axis crystallized IGZO in good crystalline state to form a second IGZO thin film. The first and second IGZO thin films form an active layer. Because the surface of the active layer is presented as C-axis crystallized IGZO, the active layer is not damaged by the copper etchant during etching source and drain so as to ensure stable performance of active layer and to avoid the development of special copper etching solution. As such, the BCE TFT substrate has stable electrical performance. The BCE TFT substrate manufactured by the above manufacturing method has stable electrical performance.

12 Claims, 5 Drawing Sheets

(51) Int. Cl.
*H01L 29/45* (2006.01)
*H01L 29/66* (2006.01)
*H01L 21/3213* (2006.01)

(52) U.S. Cl.
CPC ...... *H01L 27/1262* (2013.01); *H01L 27/1274* (2013.01); *H01L 29/45* (2013.01)

(58) Field of Classification Search
CPC ......... H01L 21/02565; H01L 21/02595; H01L 21/02628
See application file for complete search history.

(56) References Cited

U.S. PATENT DOCUMENTS

| | | | | |
|---|---|---|---|---|
| 2014/0306221 | A1* | 10/2014 | Yamazaki | H01L 29/78696 257/43 |
| 2014/0370653 | A1* | 12/2014 | Yamazaki | C23C 14/086 438/104 |
| 2018/0040721 | A1* | 2/2018 | Shi | H01L 21/027 |

FOREIGN PATENT DOCUMENTS

| | | | | |
|---|---|---|---|---|
| CN | 105489502 A | * | 4/2016 | ........... H01L 21/027 |
| CN | 106128941 A | | 11/2016 | |

* cited by examiner

BACK-CHANNEL-ETCHED TFT SUBSTRATE AND MANUFACTURING METHOD THEREOF

BACKGROUND OF THE INVENTION

1. Field of the Invention

The present invention relates to the field of display techniques, and in particular to a back-channel-etched thin film transistor (TFT) substrate and manufacturing method thereof.

2. The Related Arts

The liquid crystal display (LCD) provides advantages of thinness, low power-consumption and no radiation, and is widely used in, such as, LCD televisions, mobile phones, personal digital assistants (PDAs), digital cameras, computer screens, laptop screens, and so on.

The organic light-emitting diode (OLED) display device, also called organic electroluminescent display, is a new type of panel display device. Because the OLED display device provides the advantages of simple manufacturing process, low cost, low power consumption, high luminous efficiency, wide temperature range operation, thinness and lightness, short response time, ability to achieve color display and large-screen display, easy to realize matching with IC driver, and easy to realize flexible display, and is thus recognized as the most promising display device in the industry.

The OLED display can be classified into passive matrix OLED (PMOLED) and active matrix OLED (AMOLED) according to the driving mode, that is, the direct addressing and the thin film transistor (TFT) array addressing two categories. Among them, AMOLED has a pixel array, is an active display type, high luminous efficiency, and usually used for high-definition large-size display device.

The thin film transistor (TFT) is the main driving element in the LCD and AMOLED display device, and is directly related to the development trend of the high-performance panel display. The TFT has many types of structures, and can be manufactured in various materials. The amorphous silicon (a-Si) is the more common used material.

As the LCD and AMOLED display device develop towards the large-size and high-resolution, the only about 1 $cm^2/(Vs)$ mobility of the conventional a-Si has been unable to meet the requirements, while the metal oxide material, such as, indium gallium zinc oxide (IGZO) with the more than 10 $cm^2/(Vs)$ mobility, and the corresponding TFT fabrication compatibility with existing production line of a-Si semiconductors, has rapidly become the focus of research and development in recent years.

Compared to the conventional a-Si TFT, IGZO TFT provides the following advantages:

1. Improve the resolution of the display backplane: under the premise of guaranteeing the same transmittance, IGZO TFT display backplane resolution can be done more than 2 times of the a-Si TFT, as the carrier concentration of IGZO material is high and the mobility is high so as to reduce the size of the TFT, to ensure resolution improvement;

2. Reduce the energy consumption of the display device: compared to a-Si TFT and LTPS TFT, the leakage current of the IGZO TFT is less than 1 pA; the driving frequency is reduced from the original 30-50 Hz to 2-5 Hz, and can even reach 1 Hz through special process. Although the number of TFT driving times is reduced, the number still maintains the alignment of the LC molecules without affecting the quality of the image. As such, the power consumption of the display backplane is reduced. In addition, the high mobility of the IGZO semiconductor material enables the smaller size TFTs to provide sufficient charging ability and higher capacitance, and also improves the aperture ratio of the liquid crystal panel, the effective area of light penetration becomes larger, the same brightness can be achieved with fewer backplane components or low power consumption, and the energy consumption can be reduced;

3. by using intermittent driving, the influence of the noise of the LCD driving circuit on the touch screen detection circuit can be reduced, the higher sensitivity can be achieved, and even the tip of the ballpoint pen tip can respond. Moreover, the power can be cut off as the screen is not updated; therefore, the performance on the energy-saving performance is better.

Currently, the TFT with IGZO as semiconductor active layer generally adopts an etch stop layer (ESL) structure. The ESL can effectively protect the IGZO from being affected in the source/drain etching process, to ensure that TFT has excellent semiconductor properties. However, the manufacturing process of IGZO TFT with ESL structure is complicated and requires six photolithography processes, which is disabling for cost reduction. Therefore, the development of IGZO TFT with a back-channel-etched (BCE) structure with less photolithography processes is generally pursued.

The BCE-structured IGZO TFT is realized by removing the ESL while using copper to manufacture the source and drain to reduce the number of photolithography processes by 1. However, the known copper etching solution inevitably affects the characteristics of the superficial layer of the IGZO thin film and the oxygen balance to change the surface characteristics of the active layer of the IGZO so that the stability of the TFT substrate is deteriorated.

SUMMARY OF THE INVENTION

The object of the present invention is to provide a manufacturing method of the back-channel-etched (BCE) TFT substrate, able to ensure the active layer not damaged by the copper etching solution in the source/drain etching process, ensure the stable properties of the active layer, while avoiding the development of special copper etching solution.

Another object of the present invention is to provide a BCE TFT substrate, with stable electric properties.

To achieve the above object, the present invention provides a manufacturing method of back-channel-etched TFT substrate, comprising:

providing a base substrate, forming a gate on the base substrate, forming a gate insulating layer on the gate and the base substrate;

forming a patterned photo-resist layer on the gate insulation layer, the patternized photo-resist layer surrounding a predetermined area for an active layer on the gate insulation layer to obtain a to-be-film-formed substrate;

preparing a polycrystalline IGZO particle suspension solution, immersing the to-be-film-formed substrate in the polycrystalline IGZO particle suspension solution, covering the photo-resist layer and the gate insulating layer with a layer of polycrystalline IGZO particles to form a first IGZO thin film;

stripping off the photo-resist layer, a portion of the first IGZO thin film corresponding to the predetermined area of the active layer remaining;

depositing a second IGZO thin film on the first IGZO thin film and the gate insulating layer by a sputtering process, a portion of the second IGZO thin film corresponding to the portion above the first IGZO thin film being presented as a C-axis crystallized IGZO thin film, and a portion corresponding to the portion above the gate insulating layer being presented as an amorphous IGZO thin film;

patternizing the second IGZO thin film to remove a portion of the second IGZO thin film corresponding to the portion above the gate insulating layer and being presented as an amorphous IGZO thin film, keeping the a portion of the second IGZO thin film corresponding to the portion above the first IGZO thin film and being presented as a C-axis crystallized IGZO thin film; the kept portion of the second IGZO thin film and the first IGZO thin film together forming an active layer;

forming a source and a drain on the active layer and the gate insulating layer;

forming a passivation layer on the gate insulating layer, the source, the drain, and the active layer, forming a via on the passivation layer corresponding to the above of the drain;

forming a pixel electrode on the passivation layer, and the pixel electrode contacting with the drain through the via.

According to a preferred embodiment of the present invention, the patternized photo-resist layer is realized by coating photo-resist and lithography process.

According to a preferred embodiment of the present invention, the manufacturing method of BCE TFT substrate further comprises a step of cleaning and drying the substrate after stripping off the photo-resist layer.

According to a preferred embodiment of the present invention, the polycrystalline IGZO particle suspension solution comprises polycrystalline IGZO particles and a solvent, and the solvent is an inorganic solvent or an organic solvent.

According to a preferred embodiment of the present invention, the sputtering of the second IGZO thin film is performed at a temperature of more than 300° C.

According to a preferred embodiment of the present invention, in depositing the second IGZO thin film by the sputtering process, the polycrystalline IGZO particles in the first IGZO thin film grow as seed crystal to form the polycrystalline IGZO, and the sputtering conditions are controlled so as to make more crystalline IGZO on the first IGZO thin film appears as a C-axis crystallized IGZO.

According to a preferred embodiment of the present invention, in the process of patternizing the second IGZO thin film, oxalic acid is used to perform etching on the portion of the second IGZO thin film corresponding to the portion above the gate insulating layer and presented as amorphous IGZO.

According to a preferred embodiment of the present invention, the material of the gate, the source and the drain is copper; the material of the pixel electrode is indium tin oxide (ITO).

The present invention also provides a back-channel-etched TFT substrate, comprising: a base substrate, a gate disposed on the base substrate, a gate insulating layer disposed on the base substrate and the gate, an active layer disposed on the gate insulating layer and corresponding to the above of the gate, a source and a drain separated with interval and disposed on the active layer and the gate insulating layer, a passivation layer disposed on the source, the drain, and the active layer, and a pixel electrode disposed on the passivation layer;

a via being disposed on the passivation layer and corresponding to the above of the drain, the pixel electrode contacting with the drain through the via;

the active layer comprising the first IGZO thin film on the gate insulating layer and the second IGZO thin film on the first IGZO thin film; the first IGZO thin film being presented as a thin film formed by polycrystalline IGZO particles; the second IGZO thin film being presented as a C-axis crystallized IGZO thin film.

According to a preferred embodiment of the present invention, the material of the gate, the source and the drain is copper; the material of the pixel electrode is indium tin oxide (ITO).

The present invention also provides a manufacturing method of back-channel-etched TFT substrate, comprising:

providing a base substrate, forming a gate on the base substrate, forming a gate insulating layer on the gate and the base substrate;

forming a patternized photo-resist layer on the gate insulation layer, the patternized photo-resist layer surrounding a predetermined area for an active layer on the gate insulation layer to obtain a to-be-film-formed substrate;

preparing a polycrystalline IGZO particle suspension solution, immersing the to-be-film-formed substrate in the polycrystalline IGZO particle suspension solution, covering the photo-resist layer and the gate insulating layer with a layer of polycrystalline IGZO particles to form a first IGZO thin film;

stripping off the photo-resist layer, a portion of the first IGZO thin film corresponding to the predetermined area of the active layer remaining;

depositing a second IGZO thin film on the first IGZO thin film and the gate insulating layer by a sputtering process, a portion of the second IGZO thin film corresponding to the portion above the first IGZO thin film being presented as a C-axis crystallized IGZO thin film, and a portion corresponding to the portion above the gate insulating layer being presented as an amorphous IGZO thin film;

patternizing the second IGZO thin film to remove a portion of the second IGZO thin film corresponding to the portion above the gate insulating layer and being presented as an amorphous IGZO thin film, keeping the a portion of the second IGZO thin film corresponding to the portion above the first IGZO thin film and being presented as a C-axis crystallized IGZO thin film; the kept portion of the second IGZO thin film and the first IGZO thin film together forming an active layer;

forming a source and a drain on the active layer and the gate insulating layer;

forming a passivation layer on the gate insulating layer, the source, the drain, and the active layer, forming a via on the passivation layer corresponding to the above of the drain;

forming a pixel electrode on the passivation layer, and the pixel electrode contacting with the drain through the via;

wherein the patternized photo-resist layer being realized by coating photo-resist and lithography process.

wherein the manufacturing method of BCE TFT substrate further comprising a step of cleaning and drying the substrate after stripping off the photo-resist layer;

wherein the polycrystalline IGZO particle suspension solution comprising polycrystalline IGZO particles and a solvent, and the solvent being an inorganic solvent or an organic solvent;

wherein the sputtering of the second IGZO thin film being performed at a temperature of more than 300° C.

The present invention provides the following advantages. The manufacturing method of BCE TFT substrate of the present invention comprises forming a first IGZO thin film formed by polycrystalline IGZO particles in a predetermined area of an active layer before sputtering the IGZO, the polycrystalline IGZO particles in the first IGZO thin film used as seed crystal during the sputtering to grow a C-axis crystallized IGZO with a good crystalline state to form a second IGZO thin film, and the first and second IGZO thin films together form an active layer. Because the surface of the active layer is presented as C-axis crystallized IGZO, the active layer is not damaged by the copper etchant in the process of etching source and drain so as to ensure stable performance of the active layer and to avoid the development of a special copper etching solution. As such, the BCE TFT substrate has stable electrical performance. The BCE TFT substrate of the invention manufactured by the above manufacturing method has stable electrical performance.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
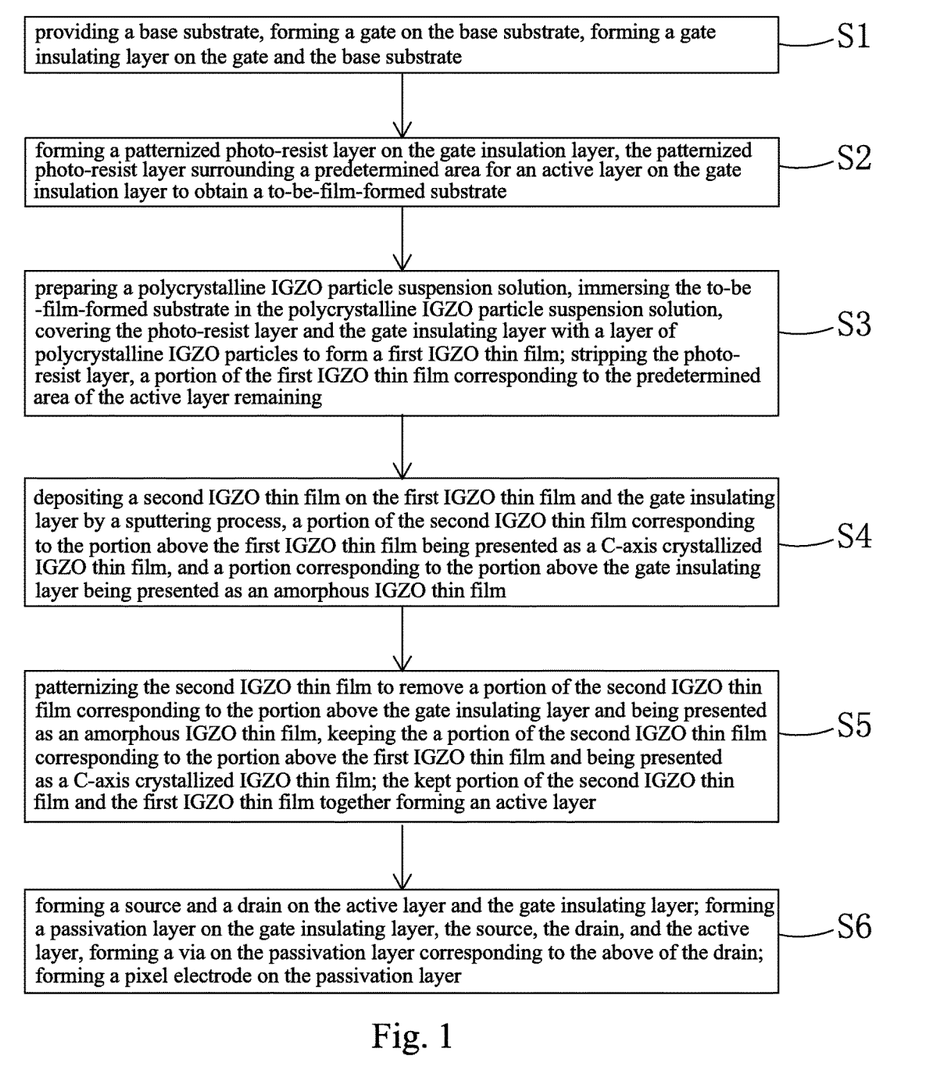
FIG. 1 is a schematic view showing a flowchart of the manufacturing method of BCE TFT substrate provided by an embodiment of the present invention.
Figure 2:
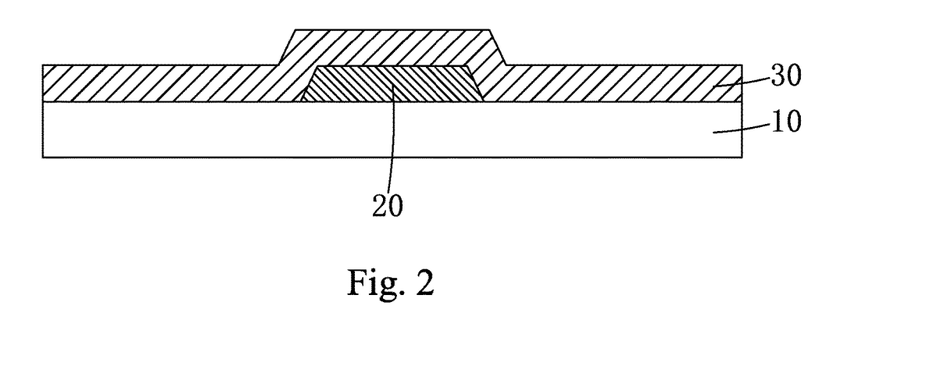
FIG. 2 is a schematic view showing Step S1 of the manufacturing method of the BCE TFT substrate provided by an embodiment of the present invention.

Referring to FIG. 1, the present invention provides a manufacturing method of back-channel-etched TFT substrate, comprising:

Step S1: as shown in FIG. 2, providing a base substrate 10, forming a gate 20 on the base substrate 10, forming a gate insulating layer 30 on the base substrate 10 and the gate 20.

Specifically, the base substrate 10 is a glass substrate.

Specifically, the materials for the gate 20 comprise one or more of the following: Mo, Al, Cu, Ti, and Cr.

Specifically, the material of the gate 20 is copper.

Specifically, the step of forming the gate 20 on the base substrate 10 comprises: depositing a first metal thin film on the base substrate 10, using a photo-etching process to patternize the first metal thin film to obtain the gate 20.

Specifically, the gate insulating layer 30 is an $SiO_x$ layer, a $SiN_x$ layer, or a complex layer formed by stacking $SiO_x$ layer and $SiN_x$ layer.

Specifically, the gate insulating layer 30 is obtained by a chemical vapor deposition (CVD) process.

Figure 3:
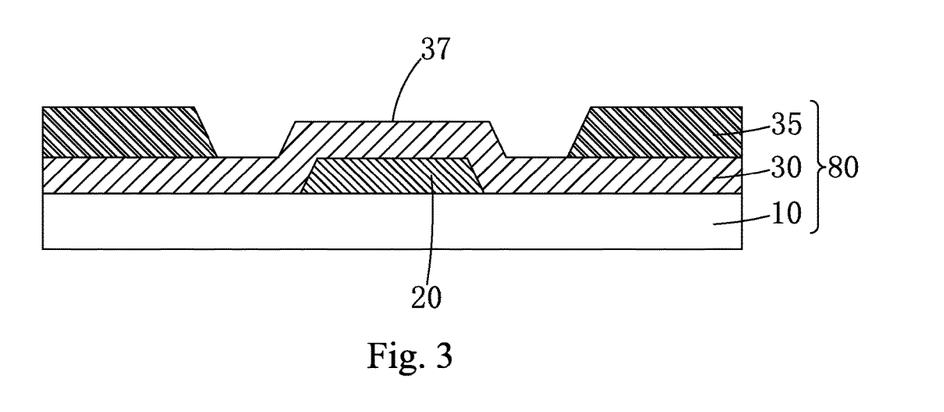
FIG. 3 is a schematic view showing Step S2 of the manufacturing method of the BCE TFT substrate provided by an embodiment of the present invention.

Step S2: as shown in FIG. 3, forming a patternized photo-resist layer 35 on the gate insulation layer 30, the patternized photo-resist layer 35 surrounding a predetermined area 37 for an active layer on the gate insulation layer 30 to obtain a to-be-film-formed substrate 80.

Specifically, the patternized photo-resist layer 35 is realized by coating photo-resist and lithography process.

Figure 4:
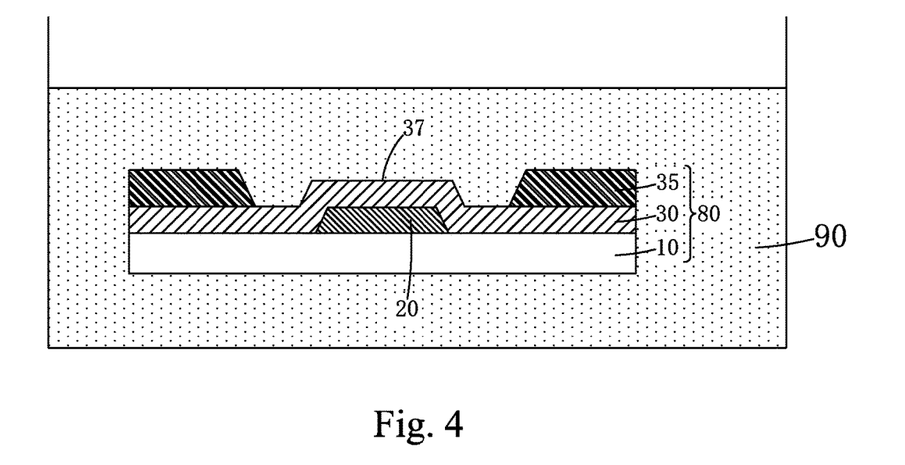
FIGS. 4-6 are schematic views showing Step S3 of the manufacturing method of the BCE TFT substrate provided by an embodiment of the present invention.
Figure 5:
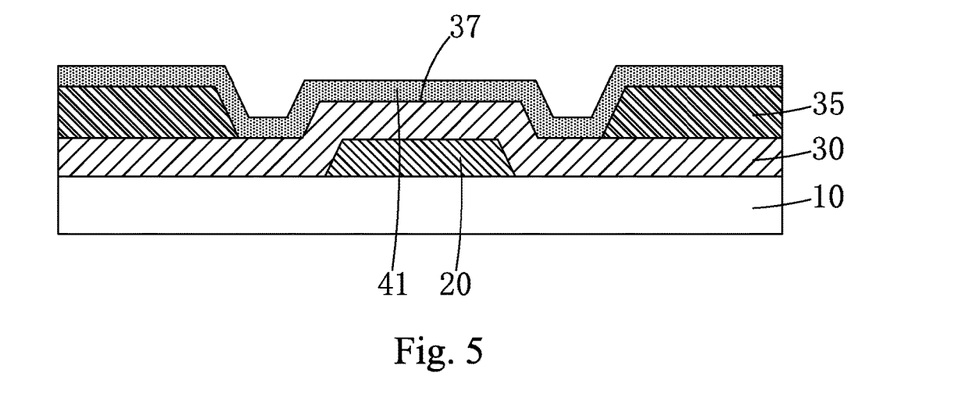
Figure 6:
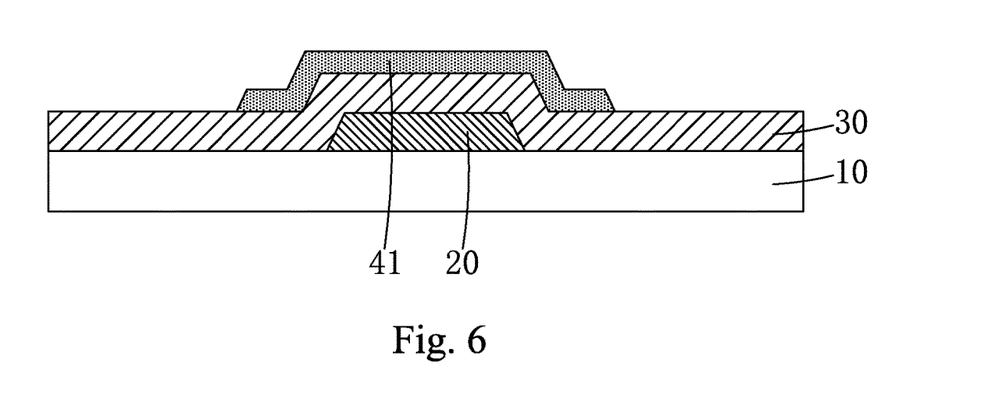

Step S3: as shown in FIG. 4 and FIG. 5, preparing a polycrystalline IGZO particle suspension solution 90, immersing the to-be-film-formed substrate 80 in the polycrystalline IGZO particle suspension solution 90, covering the photo-resist layer 35 and the gate insulating layer 30 with a layer of polycrystalline IGZO particles to form a first IGZO thin film 41;

As shown in FIG. 6, stripping off the photo-resist layer 35, a portion of the first IGZO thin film 41 corresponding to the predetermined area 37 of the active layer remains.

Specifically, the manufacturing method of BCE TFT substrate further comprises a step of cleaning and drying the substrate after stripping off the photo-resist layer 35.

Specifically, the polycrystalline IGZO particle suspension solution 90 comprises polycrystalline IGZO particles and a solvent, and the solvent is an inorganic solvent or an organic solvent.

Figure 7:
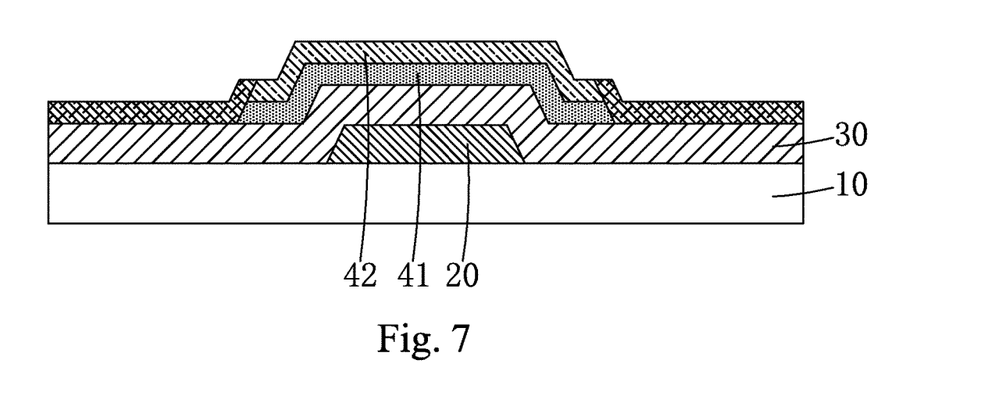
FIG. 7 is a schematic view showing Step S4 of the manufacturing method of the BCE TFT substrate provided by an embodiment of the present invention.

Step S4: as shown in FIG. 7, depositing a second IGZO thin film 42 on the first IGZO thin film 41 and the gate insulating layer 30 by a sputtering process, a portion of the second IGZO thin film 42 corresponding to the portion above the first IGZO thin film 41 being presented as a C-axis crystallized (CAAC) IGZO thin film, and a portion corresponding to the portion above the gate insulating layer 30 being presented as an amorphous IGZO thin film.

Specifically, in depositing the second IGZO thin film 42 by the sputtering process, the polycrystalline IGZO particles in the first IGZO thin film 41 grow as seed crystal to form the polycrystalline IGZO, and the sputtering conditions are controlled so as to make more crystalline IGZO on the first IGZO thin film 41 appears as a C-axis crystallized IGZO.

Specifically, the sputtering of the second IGZO thin film is performed at a temperature of more than 300° C.

Figure 8:
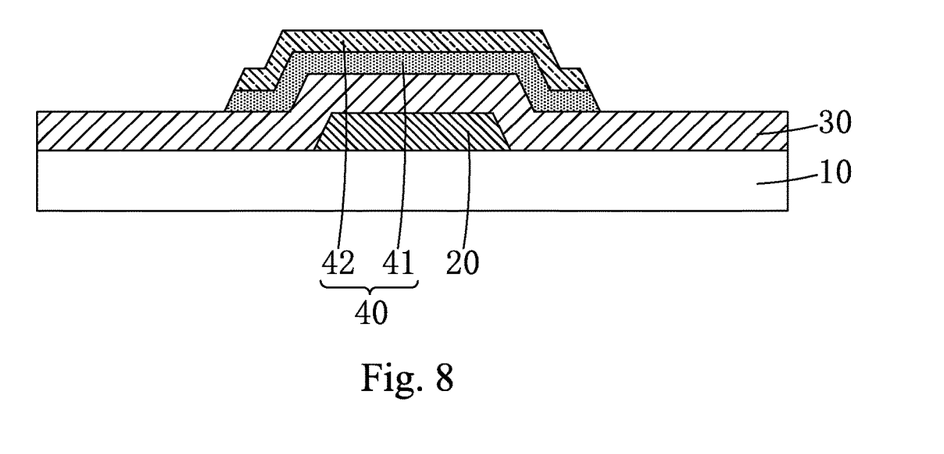
FIG. 8 is a schematic view showing Step S5 of the manufacturing method of the BCE TFT substrate provided by an embodiment of the present invention.

Step S5: as shown in FIG. 8, patternizing the second IGZO thin film 42 to remove a portion of the second IGZO thin film 42 corresponding to the portion above the gate insulating layer 30 and being presented as an amorphous IGZO thin film, keeping the a portion of the second IGZO thin film 42 corresponding to the portion above the first IGZO thin film 41 and being presented as a C-axis crystallized IGZO thin film; the kept portion of the second IGZO thin film 42 and the first IGZO thin film 41 together forming an active layer 40.

Specifically, in the process of patternizing the second IGZO thin film 42, oxalic acid is used to perform etching on the portion of the second IGZO thin film 42 corresponding to the portion above the gate insulating layer 30 and presented as amorphous IGZO.

Figure 9:
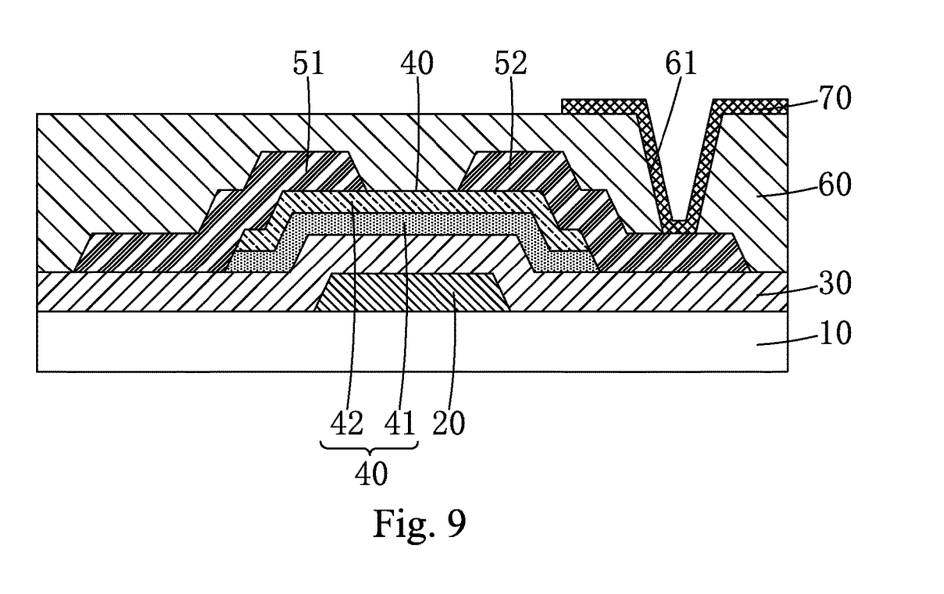
FIG. 9 is a schematic view showing Step S6 of the manufacturing method of the BCE TFT substrate and the structure of the BCE TFT substrate provided by an embodiment of the present invention.

Step S6: as shown in FIG. 9, forming a source 51 and a drain 52 on the active layer 40 and the gate insulating layer 30;

forming a passivation layer 60 on the gate insulating layer 30, the source 51, the drain 52, and the active layer 40, forming a via 61 on the passivation layer 60 corresponding to the above of the drain 52;

forming a pixel electrode 70 on the passivation layer 60, and the pixel electrode 70 contacting with the drain 52 through the via 61.

Specifically, the material of the source 51 and the drain 52 is copper.

Specifically, the step of forming the source 51 and the drain 52 separated with interval on the active layer 40 comprises: depositing a second metal thin film on the active layer 40 and the gate insulating layer 30, using a photo-etching process to patternize the second metal thin film to obtain the source 51 and the drain 52 separated with interval on the active layer 40.

Because the surface of the active layer 40 is the second IGZO thin film 42 presented as C-axis crystallized IGZO and the C-axis crystallized IGZO has extremely high corrosion resistance and is resistant to the erosion of the copper etchant, the active layer 40 is not damaged by the copper etchant in the process of etching source 51 and drain 52 so as to ensure stable performance of the active layer 40 and to avoid the development of a special copper etching solution. As such, the BCE TFT substrate has stable electrical performance.

Specifically, the material of the gate, the source and the drain are copper; the material of the pixel electrode is indium tin oxide (ITO).

The manufacturing method of BCE TFT substrate of the present invention comprises forming a first IGZO thin film 41 formed by polycrystalline IGZO particles in a predetermined area 37 of an active layer before sputtering the IGZO, the polycrystalline IGZO particles in the first IGZO thin film 41 used as seed crystal during the sputtering to grow a C-axis crystallized IGZO with a good crystalline state to form a second IGZO thin film 42, and the first and second IGZO thin films 41, 42 together form an active layer 40. Because the surface of the active layer 40 is presented as C-axis crystallized IGZO, the active layer 40 is not damaged by the copper etchant in the process of etching source 51 and drain 52 so as to ensure stable performance of the active layer 40 and to avoid the development of a special copper etching solution. As such, the BCE TFT substrate has stable electrical performance.

Refer to FIG. 9. Based on the above manufacturing method, the present invention also provides a back-channel-etched TFT substrate, comprising: a base substrate 10, a gate 20 disposed on the base substrate 10, a gate insulating layer 30 disposed on the base substrate 10 and the gate 20, an active layer 40 disposed on the gate insulating layer 30 and corresponding to the above of the gate 20, a source 51 and a drain 52 separated with interval and disposed on the active layer 40 and the gate insulating layer 30, a passivation layer 60 disposed on the source 51, the drain 52, and the active layer 40, and a pixel electrode 70 disposed on the passivation layer 60;

a via 61 being disposed on the passivation layer 60 and corresponding to the above of the drain 52, the pixel electrode 70 contacting with the drain 52 through the via 61;

the active layer 40 comprising the first IGZO thin film 41 on the gate insulating layer 30 and the second IGZO thin film 42 on the first IGZO thin film 41; the first IGZO thin film 41 being presented as a thin film formed by polycrystalline IGZO particles; the second IGZO thin film 42 being presented as a C-axis crystallized IGZO thin film.

Specifically, the materials for the gate 20 comprise one or more of the following: Mo, Al, Cu, Ti, and Cr.

Specifically, the material of the gate 20 is copper.

Specifically, the gate insulating layer 30 is an $SiO_x$ layer, a $SiN_x$ layer, or a complex layer formed by stacking $SiO_x$ layer and $SiN_x$ layer.

Specifically, the material of the source 51 and the drain 52 is copper.

Specifically, the material of the gate, the source and the drain are copper; the material of the pixel electrode is indium tin oxide (ITO).

The BCE TFT substrate of the present invention is manufactured by the above manufacturing method. The active layer 40 has a stable performance, and therefore, the BCE TFT substrate also has stable electrical performance.

In summary, the present invention provides a BCE TFT substrate and manufacturing method thereof. The manufacturing method of BCE TFT substrate of the present invention comprises forming a first IGZO thin film formed by polycrystalline IGZO particles in a predetermined area of an active layer before sputtering the IGZO, the polycrystalline IGZO particles in the first IGZO thin film used as seed crystal during the sputtering to grow a C-axis crystallized IGZO with a good crystalline state to form a second IGZO thin film, and the first and second IGZO thin films together form an active layer. Because the surface of the active layer is presented as C-axis crystallized IGZO, the active layer is not damaged by the copper etchant in the process of etching source and drain so as to ensure stable performance of the active layer and to avoid the development of a special copper etching solution. As such, the BCE TFT substrate has stable electrical performance. The BCE TFT substrate of the invention manufactured by the above manufacturing method has stable electrical performance.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of back-channel-etched (BCE) thin film transistor (TFT) substrate, comprising:

providing a base substrate, forming a gate on the base substrate, forming a gate insulating layer on the gate and the base substrate;

forming a patternized photo-resist layer on the gate insulation layer, the patternized photo-resist layer surrounding a predetermined area for an active layer on the gate insulation layer to obtain a to-be-film-formed substrate;

preparing a polycrystalline IGZO particle suspension solution, immersing the to-be-film-formed substrate in the polycrystalline IGZO particle suspension solution, covering the photo-resist layer and the gate insulating layer with a layer of polycrystalline IGZO particles to form a first IGZO thin film;

stripping off the photo-resist layer, a portion of the first IGZO thin film corresponding to the predetermined area of the active layer remaining;

depositing a second IGZO thin film on the first IGZO thin film and the gate insulating layer by a sputtering process, a portion of the second IGZO thin film corresponding to the portion above the first IGZO thin film being presented as a C-axis crystallized IGZO thin film, and a portion corresponding to the portion above the gate insulating layer being presented as an amorphous IGZO thin film;

patternizing the second IGZO thin film to remove a portion of the second IGZO thin film corresponding to the portion above the gate insulating layer and being presented as an amorphous IGZO thin film, keeping the a portion of the second IGZO thin film corresponding to the portion above the first IGZO thin film and being presented as a C-axis crystallized IGZO thin film; the kept portion of the second IGZO thin film and the first IGZO thin film together forming an active layer;

forming a source and a drain on the active layer and the gate insulating layer;

forming a passivation layer on the gate insulating layer, the source, the drain, and the active layer, forming a via on the passivation layer corresponding to the above of the drain;

forming a pixel electrode on the passivation layer, and the pixel electrode contacting with the drain through the via.

2. The manufacturing method of BCE TFT substrate as claimed in claim 1, wherein the patternized photo-resist layer is realized by coating photo-resist and lithography process.

3. The manufacturing method of BCE TFT substrate as claimed in claim 1, further comprising a step of cleaning and drying the substrate after stripping off the photo-resist layer.

4. The manufacturing method of BCE TFT substrate as claimed in claim 1, wherein the polycrystalline IGZO particle suspension solution comprises polycrystalline IGZO particles and a solvent, and the solvent is an inorganic solvent or an organic solvent.

5. The manufacturing method of BCE TFT substrate as claimed in claim 1, wherein the sputtering of the second IGZO thin film is performed at a temperature of more than 300° C.

6. The manufacturing method of BCE TFT substrate as claimed in claim 1, wherein in depositing the second IGZO thin film by the sputtering process, the polycrystalline IGZO particles in the first IGZO thin film grow as seed crystal to form the polycrystalline IGZO, and the sputtering conditions are controlled so as to make more crystalline IGZO on the first IGZO thin film appears as a C-axis crystallized IGZO.

7. The manufacturing method of BCE TFT substrate as claimed in claim 1, wherein in the process of patternizing the second IGZO thin film, oxalic acid is used to perform etching on the portion of the second IGZO thin film corresponding to the portion above the gate insulating layer and presented as amorphous IGZO.

8. The manufacturing method of BCE TFT substrate as claimed in claim 1, wherein the material of the gate, the source and the drain is copper; the material of the pixel electrode is indium tin oxide (ITO).

9. A manufacturing method of back-channel-etched (BCE) thin film transistor (TFT) substrate, comprising:

providing a base substrate, forming a gate on the base substrate, forming a gate insulating layer on the gate and the base substrate;

forming a patternized photo-resist layer on the gate insulation layer, the patternized photo-resist layer surrounding a predetermined area for an active layer on the gate insulation layer to obtain a to-be-film-formed substrate;

preparing a polycrystalline IGZO particle suspension solution, immersing the to-be-film-formed substrate in the polycrystalline IGZO particle suspension solution, covering the photo-resist layer and the gate insulating layer with a layer of polycrystalline IGZO particles to form a first IGZO thin film;

stripping off the photo-resist layer, a portion of the first IGZO thin film corresponding to the predetermined area of the active layer remaining;

depositing a second IGZO thin film on the first IGZO thin film and the gate insulating layer by a sputtering process, a portion of the second IGZO thin film corresponding to the portion above the first IGZO thin film being presented as a C-axis crystallized IGZO thin film, and a portion corresponding to the portion above the gate insulating layer being presented as an amorphous IGZO thin film;

patternizing the second IGZO thin film to remove a portion of the second IGZO thin film corresponding to the portion above the gate insulating layer and being presented as an amorphous IGZO thin film, keeping the a portion of the second IGZO thin film corresponding to the portion above the first IGZO thin film and being presented as a C-axis crystallized IGZO thin film; the kept portion of the second IGZO thin film and the first IGZO thin film together forming an active layer;

forming a source and a drain on the active layer and the gate insulating layer;

forming a passivation layer on the gate insulating layer, the source, the drain, and the active layer, forming a via on the passivation layer corresponding to the above of the drain;

forming a pixel electrode on the passivation layer, and the pixel electrode contacting with the drain through the via;

wherein the patternized photo-resist layer being realized by coating photo-resist and lithography process;

further comprising a step of cleaning and drying the substrate after stripping off the photo-resist layer;

wherein the polycrystalline IGZO particle suspension solution comprising polycrystalline IGZO particles and a solvent, and the solvent being an inorganic solvent or an organic solvent;

wherein the sputtering of the second IGZO thin film being performed at a temperature of more than 300° C.

10. The BCE TFT substrate as claimed in claim 9, wherein in depositing the second IGZO thin film by the sputtering process, the polycrystalline IGZO particles in the first IGZO thin film grow as seed crystal to form the polycrystalline IGZO, and the sputtering conditions are controlled so as to make more crystalline IGZO on the first IGZO thin film appears as a C-axis crystallized IGZO.

11. The BCE TFT substrate as claimed in claim 9, wherein in the process of patternizing the second IGZO thin film, oxalic acid is used to perform etching on the portion of the second IGZO thin film corresponding to the portion above the gate insulating layer and presented as amorphous IGZO.

12. The BCE TFT substrate as claimed in claim 9, wherein the material of the gate, the source and the drain is copper; the material of the pixel electrode is indium tin oxide (ITO).

* * * * *